United States Patent
Li et al.

(10) Patent No.: US 12,200,881 B2
(45) Date of Patent: Jan. 14, 2025

(54) FLEXIBLE SUPPORT STRUCTURE FOR A SLIDING FLEXIBLE DISPLAY

(71) Applicant: Huawei Technologies Co., Ltd., Shenzhen (CN)

(72) Inventors: Xueqiang Li, Shenzhen (CN); Miika Keskinen, Kista (SE); Mika Ojanto, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 108 days.

(21) Appl. No.: 17/759,663

(22) PCT Filed: Jan. 29, 2020

(86) PCT No.: PCT/EP2020/052075
§ 371 (c)(1),
(2) Date: Jul. 28, 2022

(87) PCT Pub. No.: WO2021/151473
PCT Pub. Date: Aug. 5, 2021

(65) Prior Publication Data
US 2023/0072326 A1    Mar. 9, 2023

(51) Int. Cl.
*H05K 5/02*      (2006.01)
*G06F 1/16*      (2006.01)

(52) U.S. Cl.
CPC ......... *H05K 5/0217* (2013.01); *G06F 1/1652* (2013.01)

(58) Field of Classification Search
CPC .. H05K 5/0217; H05K 5/0018; G06F 1/1652; G06F 1/1624; H04M 1/0268; H04M 1/0237; H04M 1/0269
See application file for complete search history.

(56) References Cited

U.S. PATENT DOCUMENTS

| | | | | |
|---|---|---|---|---|
| 10,476,011 | B2* | 11/2019 | Kang | G02F 1/133308 |
| 10,747,269 | B1* | 8/2020 | Choi | G06F 1/1641 |
| 11,169,580 | B2* | 11/2021 | Lee | G06F 1/1652 |
| 11,805,605 | B2* | 10/2023 | Yoon | H05K 5/0017 |
| 2013/0216740 | A1 | 8/2013 | Russell-Clarke et al. | |
| 2015/0055287 | A1* | 2/2015 | Seo | G06F 1/1681 |
| | | | | 361/679.27 |
| 2015/0077917 | A1* | 3/2015 | Song | G06F 1/1652 |
| | | | | 361/679.27 |
| 2016/0187935 | A1* | 6/2016 | Tazbaz | H04M 1/0216 |
| | | | | 361/679.55 |

(Continued)

FOREIGN PATENT DOCUMENTS

| | | |
|---|---|---|
| CN | 109949706 A | 6/2019 |
| EP | 3547101 A1 | 10/2019 |

(Continued)

*Primary Examiner* — Sagar Shrestha
(74) *Attorney, Agent, or Firm* — Slater Matsil, LLP

(57) ABSTRACT

A foldable support structure for a rolling display arrangement comprises a foldable sheet and a support arrangement comprising a plurality of support rods arranged to support the foldable sheet. The center axes of the support rods extend in parallel with each other and with the foldable sheet. The foldable sheet comprises a sheet material and a throughgoing slit pattern allowing the sheet material to fold around a folding axis parallel with the center axes. Each support rod is connected to the foldable sheet by means of a plurality of attachments.

18 Claims, 3 Drawing Sheets

(56) References Cited

U.S. PATENT DOCUMENTS

| | | | |
|---|---|---|---|
| 2016/0195901 A1* | 7/2016 | Kauhaniemi | G06F 1/1652 |
| | | | 361/679.27 |
| 2018/0020556 A1 | 1/2018 | Seo et al. | |
| 2019/0037710 A1* | 1/2019 | Han | G09F 9/301 |
| 2019/0174640 A1* | 6/2019 | Park | G02F 1/133305 |
| 2019/0268455 A1 | 8/2019 | Baek et al. | |
| 2020/0004296 A1* | 1/2020 | Lee | G06F 1/1641 |
| 2020/0363841 A1* | 11/2020 | Kim | G06F 1/1675 |
| 2021/0074189 A1* | 3/2021 | Kwon | H05K 5/0217 |
| 2022/0174829 A1* | 6/2022 | Choi | G06F 1/1637 |
| 2022/0253103 A1* | 8/2022 | Choi | G09F 9/301 |
| 2023/0007111 A1* | 1/2023 | Lee | H04M 1/0235 |
| 2023/0209750 A1* | 6/2023 | Kim | H02J 7/0042 |
| | | | 361/807 |

FOREIGN PATENT DOCUMENTS

| | | |
|---|---|---|
| KR | 20150024172 A | 3/2015 |
| WO | 2019179616 A1 | 9/2019 |

* cited by examiner

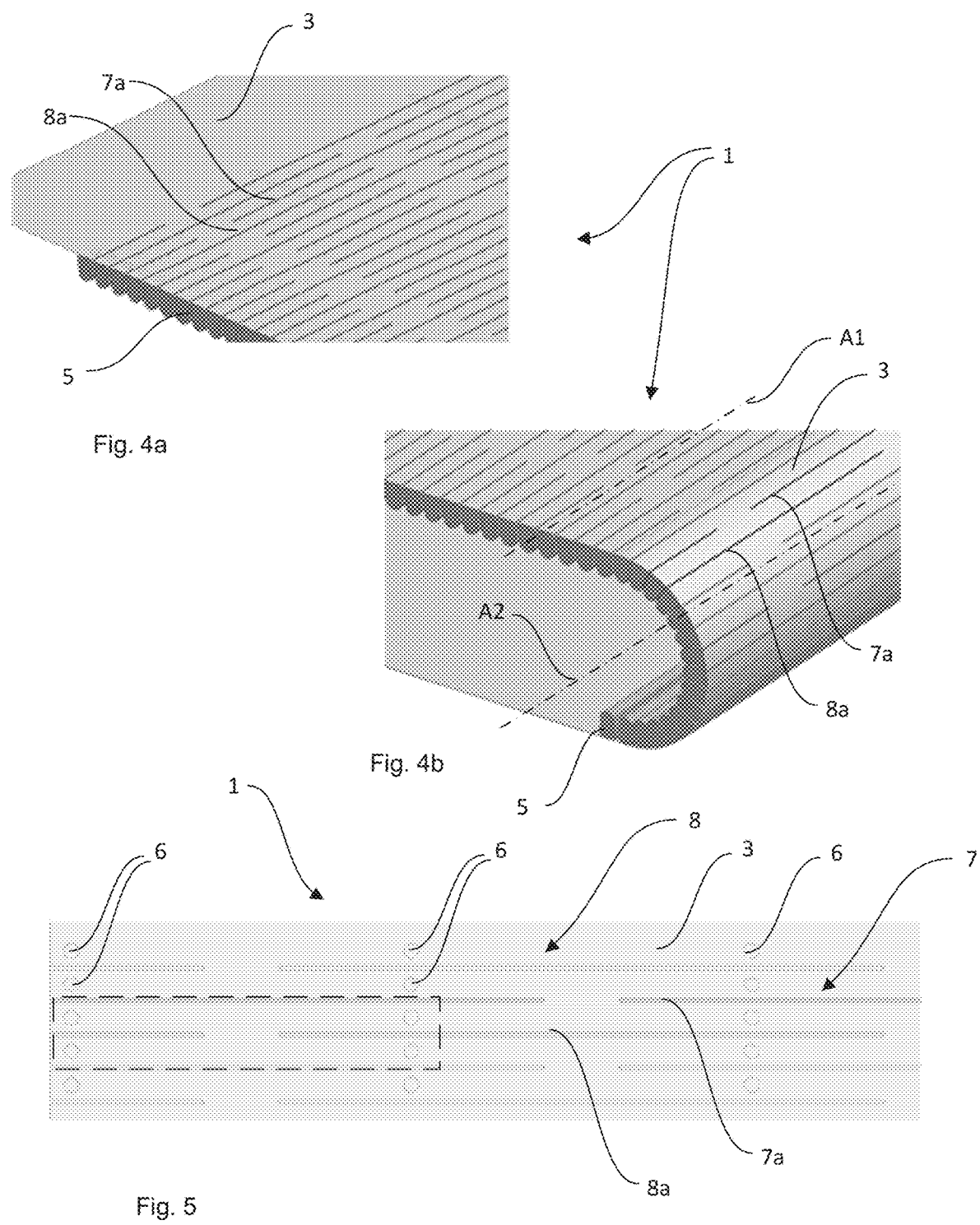

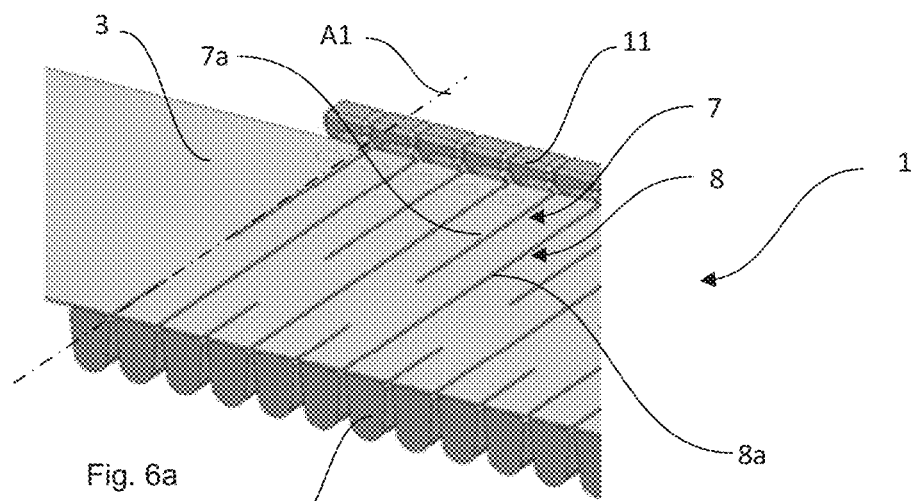
Fig. 6a
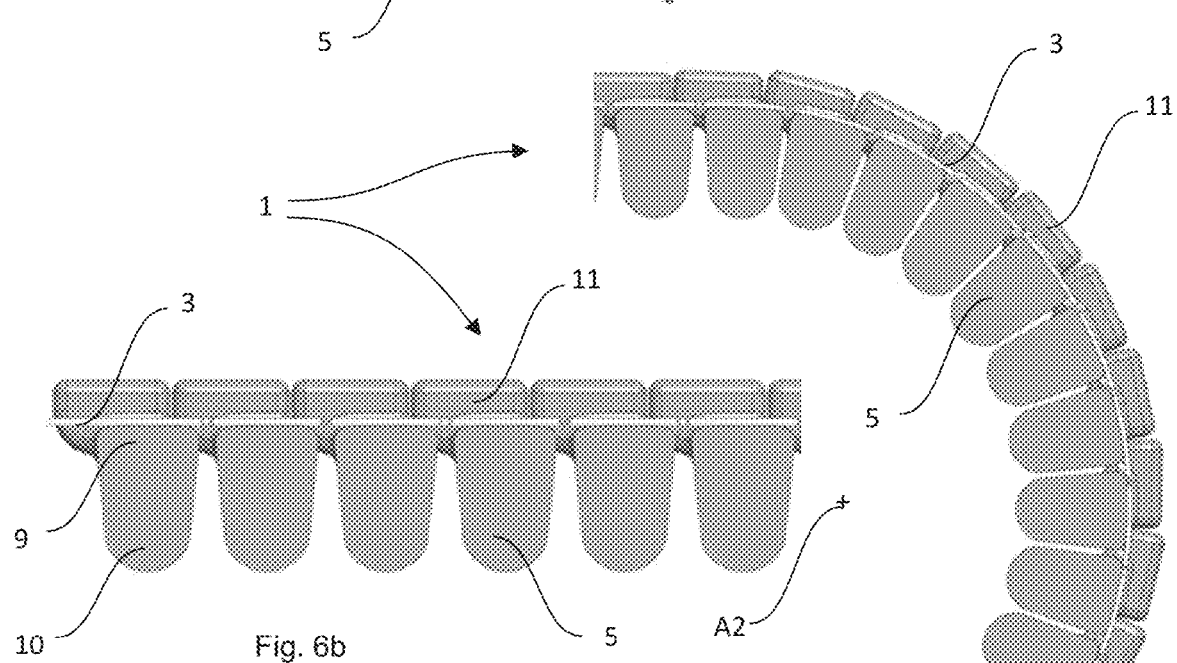
Fig. 6b
Fig. 6c
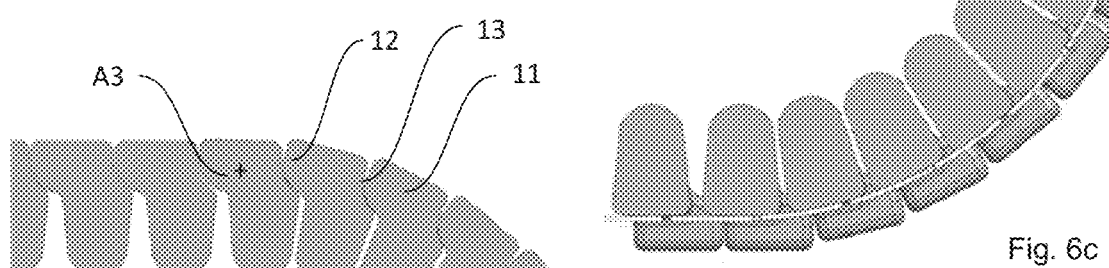
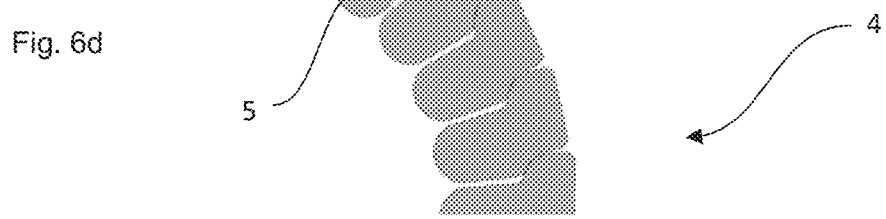
Fig. 6d

FLEXIBLE SUPPORT STRUCTURE FOR A SLIDING FLEXIBLE DISPLAY

CROSS-REFERENCE TO RELATED APPLICATIONS

This application is a National Stage of International Application No. PCT/EP2020/052075, filed on Jan. 29, 2020, which is hereby incorporated by reference in its entirety.

TECHNICAL FIELD

The disclosure relates to foldable support structure for a rolling display arrangement, and an electronic device comprising such a rolling display arrangement.

BACKGROUND

The size of mobile devices, such as tablets and mobile phones, is an important consideration when designing mobile devices. In order to provide the best mobile device possible, the outer dimensions of the device have to be as small as is technically feasible, while still allowing the display of the device to be as large as possible.

This problem may be solved, e.g., by means of a foldable electronic device comprising one or several support bodies, e.g. interconnected by means of hinges, covered by a display. The support body/bodies and the display can be folded together to provide an as small electronic device as possible, i.e. at least partially covering both main faces of the device, and unfolded to provide an as large display as possible, i.e. the display covering only one main face of the device and protruding from said main face.

As the bending radius of the display changes, there will inevitably be more or less deformation of the display. This is due to, as the display is folded around the electronic device, the display stretching on one side of the neutral axis and compressing on the other side of the neutral axis. The neutral axis is the axis along which the display or the housing remains unchanged as the device is folded, i.e. it neither stretches nor compresses.

The situation is even more complex when the display is extendable. In this case, the display is both bent around the device and moving around the edge of the device as it is extended. The display is constantly bending and unbending over a large area, and has to be supported such that the entire affected display area manages the bending and unbending without permanently deforming.

SUMMARY

It is an object to provide an improved rolling display arrangement. The foregoing and other objects are achieved by the features of the independent claims. Further implementation forms are apparent from the dependent claims, the description, and the figures.

According to a first aspect, there is provided a foldable support structure for a rolling display arrangement, comprising a foldable sheet and a support arrangement comprising a plurality of support rods arranged to support the foldable sheet, center axes of the support rods extending in parallel with each other and with the foldable sheet, the foldable sheet comprising a sheet material and a throughgoing slit pattern allowing the sheet material to fold around a folding axis parallel with the center axes, each support rod being connected to the foldable sheet by means of a plurality of attachments.

This solution provides a foldable support structure which facilitates that, as the display is folded around the electronic device, there is as little stretching and compression as possible, hence reducing the amount of deformation that the display is subjected to.

In a possible implementation form of the first aspect, the slit pattern comprises a plurality of first slit arrangements having a first configuration and a plurality of second slit arrangements having a second configuration, the first slit arrangements and the second slit arrangements being alternately arranged in a first direction perpendicular to the folding axis. This facilitates a support structure which is stiff enough to keep the surface of a display, supported by the support structure, flat.

In a further possible implementation form of the first aspect, the first slit arrangement comprises a plurality of sequentially arranged first slits, the first slits extending in parallel with the folding axis, each first slit being separated from at least one adjacent first slit by a section of integral sheet material.

In a further possible implementation form of the first aspect, the second slit arrangement comprises a plurality of sequentially arranged second slits, the second slits extending in parallel with the folding axis, each second slit being separated from at least one adjacent second slit by a section of integral sheet material.

In a further possible implementation form of the first aspect, the first slits and the second slits have identical dimensions in the first direction, providing even flexibility across the foldable sheet.

In a further possible implementation form of the first aspect, the second slits are offset in relation to the first slits, in the first direction, such that ends of the first slits are located along the folding axis at points which are different from points at which ends of the second slits are located, providing a foldable sheet which is sufficiently stiff in the direction perpendicular to the main plane of the foldable sheet.

In a further possible implementation form of the first aspect, each first slit and second slit extends between two adjacent support rods, such that the first slit and second slit do not overlap any of the support rods, allowing as much of the foldable sheet as possible to be directly supported by the support rods.

In a further possible implementation form of the first aspect, at least one attachment is provided on each side of each first slit and each second slit, such that a plurality of attachments are provided between each pair of adjacent first slit arrangement and second slit arrangement.

In a further possible implementation form of the first aspect, a shape and/or dimension of at least one first slit and at least one second slit changes when folding the foldable sheet around the folding axis, facilitating the bending of the foldable sheet.

In a further possible implementation form of the first aspect, the sheet material comprises a plurality of sub-areas, each sub-area being delimited by two second slits from two adjacent second slit arrangements, the sub-area being partially divided into two longitudinally extending halves by two first slits from a first slit arrangement being located between the two adjacent second slit arrangements, such that the sub-area has a substantially H-formed shape.

In a further possible implementation form of the first aspect, one attachment is arranged at each corner of the H-formed shape, which allows the foldable sheet to bend and deform easily.

In a further possible implementation form of the first aspect, each support rod is substantially tapered from a base section to an apex section, the base section being arranged adjacent the foldable sheet, and the apex sections being moved towards each other when the foldable sheet is folded around the folding axis, allowing the support rods to rotate around the folding axis without colliding.

In a further possible implementation form of the first aspect, the base section comprises a concave surface, the concave surface being in supportive abutment the foldable sheet, and allowing the foldable sheet to extend as smoothly as possible when the foldable support assembly folds.

In a further possible implementation form of the first aspect, the support arrangement further comprises end supports located at each end of the support rods, the end supports extending in a direction substantially perpendicular to the center axis of the support rod, each support rod being pivotally interconnected with at least one adjacent support rod by means of the end supports such that center axes of the support rods are located on one side of the foldable sheet, and the interconnections are arranged on an opposite side of the foldable sheet, allowing the support rods to rotate while at the same time keeping the neutral axis at a constant level.

In a further possible implementation form of the first aspect, the end supports comprise at least one protrusion and at least one recess, the protrusion and the recess having complimentary shapes, such that a protrusion of one end support interconnects with a recess of an adjacent end support, facilitating simple yet reliable means for rotation.

In a further possible implementation form of the first aspect, each end support is pivotable in relation to an adjacent end support, around a pivot axis, the pivot axis being arranged in a neutral plane of the support arrangement such that the neutral plane remains constant as the foldable sheet is folded.

According to a second aspect, there is provided a rolling display arrangement for an electronic device, the rolling display arrangement comprising a foldable display and the foldable support structure according to the above, the foldable support structure supporting the display. This solution provides a rolling display arrangement which facilitates that, as the display is folded around the electronic device, there is as little stretching and compression of the display as possible.

In a possible implementation form of the second aspect, a distance between a pivot axis of the end supports of the foldable support structure and the display is such that a neutral axis of the foldable support structure extends as close to the display as possible. This allows the foldable display to be fixed to the foldable support structure such that the neutral axis is as close to the foldable display as possible, hence reducing the amount of deformation that the display is subjected to.

According to a third aspect, there is provided an electronic device comprising a chassis module, two end cap modules arranged at opposite short sides of the chassis module, and a rolling display arrangement according to the above, the rolling display arrangement partially enclosing the chassis module, the rolling display arrangement being interlocked with the chassis module by means of grooves extending in the end cap modules in a direction perpendicular to a folding axis of the foldable support structure of the rolling display arrangement, opposing edges of the rolling display arrangement interconnecting with the grooves. This which allows a rolling display arrangement which slides reliably around the electronic device without the display deforming.

In a possible implementation form of the third aspect, the rolling display arrangement may be in one of a retracted position and an extended position.

This and other aspects will be apparent from the embodiments described below.

BRIEF DESCRIPTION OF THE DRAWINGS

In the following detailed portion of the present disclosure, the aspects, embodiments and implementations will be explained in more detail with reference to the example embodiments shown in the drawings, in which:

FIG. 4a shows a perspective view of non-folded section of a foldable support structure in accordance with one embodiment of the present invention;

FIG. 4b shows a perspective view of the embodiment of FIG. 4a, wherein the foldable support structure is folded around a folding axis;

FIG. 5 shows a top view of the foldable sheet of the foldable support structure in accordance with one embodiment of the present invention;

FIG. 6a shows perspective view of a foldable support structure in accordance with one embodiment of the present invention;

FIG. 6b shows a cross-sectional side view of a non-folded section of the embodiment shown in FIG. 6a;

FIG. 6c shows a cross-sectional side view of the embodiment shown in FIGS. 6a and 6b, wherein the foldable support structure is folded around a folding axis;

FIG. 6d shows a schematic side view of the support arrangement of the foldable support structure in accordance with one embodiment of the present invention.

DETAILED DESCRIPTION OF ILLUSTRATIVE EMBODIMENTS

Figure 1A:
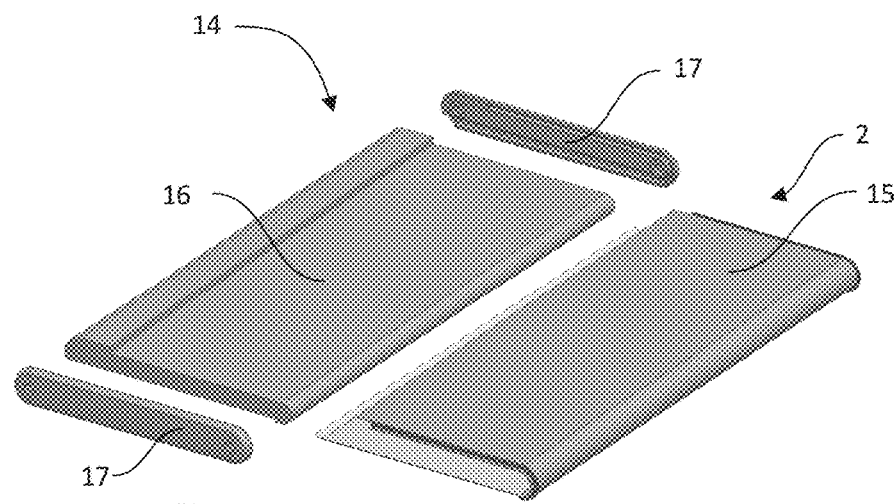
FIG. 1a shows an exploded view of an electronic device in accordance with one embodiment of the present invention.

FIGS. 2, 3, 4a-4b, and 6a-6d show a foldable support structure 1 for a rolling display arrangement 2.

The foldable support structure 1 comprises a foldable sheet 3 and a support arrangement 4 comprising a plurality of support rods 5 arranged to support the foldable sheet 3. The center axes A1 of the support rods 5 extend in parallel with each other and with the foldable sheet 3. The support rods 5 are preferably made of stiff material such that they do not bend in any direction, but remain essentially straight regardless of their position.

The foldable sheet 3 comprises a sheet material and a throughgoing slit pattern allowing the sheet material to fold around a folding axis A2 parallel with the center axes A1, as shown FIG. 5. The sheet material is preferably stiff enough to keep the surface of the display of the rolling display arrangement flat in a direction perpendicular to the main plane of the foldable support structure 1, and perpendicular to the center axes A1 and folding axis A2.

The slit pattern may comprise a plurality of first slit arrangements 7 having a first configuration and a plurality of second slit arrangements 8 having a second configuration. The first slit arrangements 7 and the second slit arrangements 8 may alternately arranged in a first direction perpendicular to the folding axis A2.

The first slit arrangement 7 may comprise a plurality of sequentially arranged first slits 7a, the first slits 7a extending in parallel with the folding axis A2. Each first slit 7a is separated from at least one adjacent first slit 7a by a section of integral sheet material.

Correspondingly, the second slit arrangement 8 may comprise a plurality of sequentially arranged second slits 8a, the second slits 8a extending in parallel with the folding axis A2. Each second slit 8a is separated from at least one adjacent second slit 8a by a section of integral sheet material.

In one embodiment, the first slits 7a and the second slits 8a have identical dimensions in the first direction.

As shown in FIG. 5, the second slits 8a may be offset in relation to the first slits 7a, in the first direction, such that ends of the first slits 7a are located along the folding axis A2 at points which are different from points at which ends of the second slits 8a are located.

Each first slit 7a and each second slit 8a may extend between two adjacent support rods 5, such that the first slit 7a and second slit 8a do not overlap any of the support rods 5.

Each support rod 5 is connected to the foldable sheet 3 by means of a plurality of attachments 6. At least one attachment 6 may be provided on each side of each first slit 7a and each second slit 8a, such that a plurality of attachments 6 are provided between each pair of adjacent first slit arrangement 7 and second slit arrangement 8.

The shape and/or dimensions of at least one first slit 7a and at least one second slit 8a may change when folding the foldable sheet 3 around the folding axis A2.

The sheet material may comprise a plurality of sub-areas, each sub-area being delimited by two second slits 8a from two adjacent second slit arrangements. The sub-area is partially divided into two longitudinally extending halves by two first slits 7a from a first slit arrangement 7 being located between the two adjacent second slit arrangements 8, such that the sub-area has a substantially H-formed shape. One attachment 6 may be arranged at each corner of the H-formed shape.

Each support rod 5 may be substantially tapered, as shown in FIGS. 3 and 6a-6d, such that the support rods 5 do not collide as the foldable support structure 1 folds. The tapering extends from a base section 9 to an apex section 10, the base section 9 being arranged adjacent the foldable sheet 3. The apex sections 10 are moved towards each other when the foldable sheet 3 is folded around the folding axis A2, as shown in FIG. 6c. The base section 9 may comprise a concave surface (not shown), the concave surface being in supportive abutment the foldable sheet 3. This allows the foldable sheet 3 to extend as smoothly as possible when the foldable support assembly 1 folds.

The support arrangement 4 may further comprise end supports 11 located at each end of the support rods 5, as shown in FIGS. 6a-6d. The end supports 11 extend in a direction substantially perpendicular to the center axis A1 of the support rod. Each support rod 5 is pivotally interconnected with at least one adjacent support rod 5 by means of the end supports 11 such that center axes A1 of the support rods 5 are located on one side of the foldable sheet 3, and the interconnections are arranged on an opposite side of the foldable sheet 3.

The end supports 11 may comprise at least one protrusion 12 and at least one recess 13, as shown in FIG. 6d. The protrusion 12 and the recess 13 have complimentary shapes, such that a protrusion 12 of one end support 11 interconnects with a recess 13 of an adjacent end support 11.

Each end support 11 is pivotable in relation to an adjacent end support 11 around a pivot axis A3. The pivot axis A3 is arranged in a neutral plane of the support arrangement 4 such that the neutral plane remains constant as the foldable sheet 3 is folded. This allows the support rods 5 to rotate while at the same time keeping the neutral axis at a constant level.

The present invention further relates to a rolling display arrangement 2 for an electronic device 14. As shown in FIG. 1a, the rolling display arrangement 2 comprises a foldable display 15 and the foldable support structure 1 described above. The foldable support structure 1 supports the display 15.

A distance between a pivot axis A3 of the end supports 11 of the foldable support structure 1 and the display 15 is such that a neutral axis of the foldable support structure 1 extends as close to the display 15 as possible.

Figure 1B:
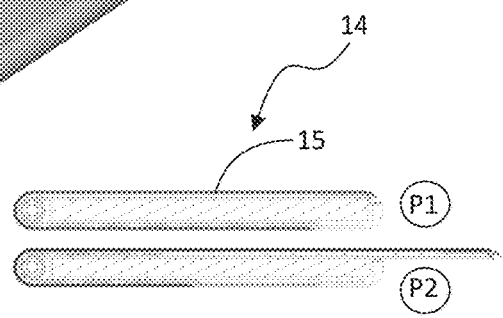
FIG. 1b shows a cross-sectional side view of an electronic device comprising a rolling display arrangement in accordance with one embodiment of the present invention, the rolling display arrangement being in a retracted position and an extended position.
Figure 2:
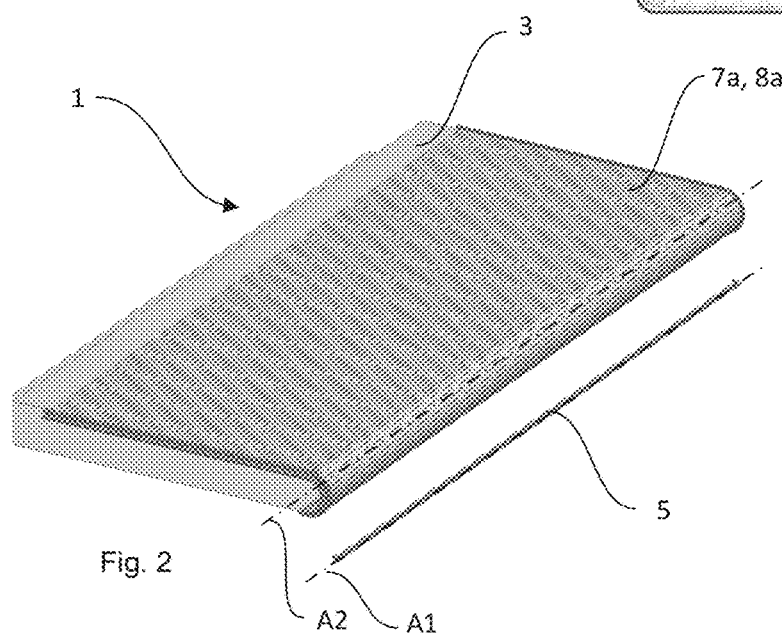
FIG. 2 shows a perspective view of a foldable support structure in accordance with one embodiment of the present invention.
Figure 3:
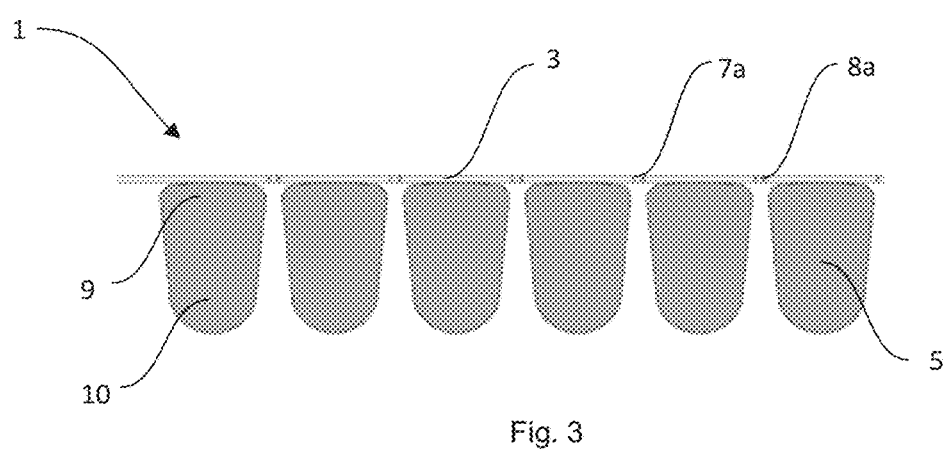
FIG. 3 shows a cross-sectional side view of the embodiment shown in FIG. 2.

The present invention also relates to an electronic device 14, shown in FIGS. 1a and 1b, comprising a chassis module 16, two end cap modules 17 arranged at opposite short sides of the chassis module 16, and a rolling display arrangement 2 according to the above.

The rolling display arrangement 2 partially encloses the chassis module 16, and is interlocked with the chassis module 16 by means of grooves extending in the end cap modules 17 in a direction perpendicular to the folding axis A2 of the foldable support structure 1 of the rolling display arrangement 2. Opposing edges of the rolling display arrangement 2 interconnect with the grooves, which allows the rolling display arrangement 2 to slide around the electronic device 14.

The rolling display arrangement 2 may be in one of a retracted position P1 and an extended position P2, as shown in FIG. 1b.

The various aspects and implementations have been described in conjunction with various embodiments herein. However, other variations to the disclosed embodiments can be understood and effected by those skilled in the art in practicing the claimed subject-matter, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

The reference signs used in the claims shall not be construed as limiting the scope. Unless otherwise indicated, the drawings are intended to be read e.g., cross-hatching, arrangement of parts, proportion, degree, etc. together with the specification, and are to be considered a portion of the entire written description of this disclosure. As used in the description, the terms "horizontal", "vertical", "left", "right", "up" and "down", as well as adjectival and adverbial derivatives thereof e.g., "horizontally", "rightwardly", "upwardly", etc., simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

The invention claimed is:

1. A foldable support structure, comprising:
   a flexible sheet comprising a sheet material, wherein a slit pattern of the sheet material allows the sheet material to fold around a folding axis; and
   a support arrangement comprising a plurality of support rods arranged to support the flexible sheet, wherein center axes of the plurality of support rods extend in parallel with each other, the flexible sheet, and the folding axis, and each support rod of the plurality of support rods is connected to the flexible sheet using a plurality of attachments, and wherein each slit of the flexible sheet extends between two adjacent support rods in a manner that each slit does not overlap any of the plurality of support rods.

2. The foldable support structure according to claim 1, wherein the slit pattern comprises a plurality of first slits having a first configuration and a plurality of second slits having a second configuration, and the plurality of first slits and the plurality of second slits are alternately arranged in a first direction perpendicular to the folding axis.

3. The foldable support structure according to claim 2, wherein the plurality of first slits comprises a plurality of sequentially arranged first slits, the plurality of sequentially arranged first slits extends in parallel with the folding axis, and each first slit of the plurality of sequentially arranged first slits is separated from at least one adjacent first slit of the plurality of sequentially arranged first slits by a section of integral sheet material.

4. The foldable support structure according to claim 3, wherein the plurality of second slits comprises a plurality of sequentially arranged second slits, the plurality of sequentially arranged second slits extends in parallel with the folding axis, and each second slit of the plurality of sequentially arranged second slits is separated from at least one adjacent second slit of the plurality of sequentially arranged second slits by a section of integral sheet material.

5. The foldable support structure according to claim 3, wherein the plurality of first slits and the plurality of second slits have identical dimensions in the first direction.

6. The foldable support structure according to claim 3, wherein the plurality of second slits are offset in relation to the plurality of first slits, in the first direction, in a manner that ends of the plurality of first slits are located along the folding axis at points which are different from points at which ends of the plurality of second slits are located.

7. The foldable support structure according to claim 3, wherein at least one attachment is disposed on each side of each first slit and each second slit in a manner that a plurality of attachments are disposed between each pair of adjacent first slits and second slits.

8. The foldable support structure according to claim 3, wherein the foldable support structure is configured in a manner that a shape or a dimension of at least one first slit of the plurality of first slits and at least one second slit of the plurality of second slits changes when the flexible sheet is folded around the folding axis.

9. The foldable support structure according to claim 3, wherein the sheet material comprises a plurality of sub-areas, each sub-area of the plurality of sub-areas is delimited by two second slits of the plurality of second slits, and each sub-area is partially divided into two longitudinally extending halves by two first slits of the plurality of first slits that are located between the corresponding two adjacent second slits in a manner that each sub-area has an H-formed shape.

10. The foldable support structure according to claim 9, wherein an attachment is arranged at each corner of each H-formed shape.

11. The foldable support structure according to claim 1, wherein each support rod of the plurality of support rods is tapered from a base section to an apex section, and the base section is arranged adjacent to the flexible sheet; and
    wherein the apex section of each support rod is being moved towards another apex section of another support rod when the flexible sheet is folded around the folding axis.

12. The foldable support structure according to claim 11, wherein the base section of each support rod comprises a concave surface, and each concave surface of each base station is in supportive abutment with the flexible sheet.

13. The foldable support structure according to claim 1, wherein the support arrangement further comprises end supports located at each end of the plurality of support rods, the end supports extending in a direction perpendicular to the center axis of each support rod; and
    wherein each support rod of the plurality of support rods is pivotally interconnected with at least one adjacent support rod by means of the end supports in a manner that that center axes of the plurality of support rods are located on a first side of said flexible sheet, and the interconnections are arranged on a second side of the flexible sheet, the second side being opposite to the first side.

14. The foldable support structure according to claim 13, wherein each of the end supports comprise at least one protrusion and at least one recess, and the protrusion and the recess of each support rod have complimentary shapes in a manner that a protrusion of one end support interconnects with a recess of an adjacent end support.

15. The foldable support structure according to claim 13, wherein each end support of the end supports is pivotable in relation to an adjacent end support of the end supports around a pivot axis; and
    wherein the pivot axis is arranged in a plane of the support arrangement that remains constant as the flexible sheet is folded.

16. A rolling display arrangement, comprising:
    a flexible display and a flexible support structure, the flexible support structure supporting the flexible display, and the flexible support structure comprising:
      a flexible sheet comprising a sheet material, wherein a slit pattern of the sheet material allows the sheet material to fold around a folding axis; and
      a support arrangement comprising a plurality of support rods arranged to support the flexible sheet, wherein center axes of the plurality of support rods extend in parallel with each other, the flexible sheet, and the folding axis, and each support rod is connected to the flexible sheet by a plurality of attachments, and wherein each slit of the flexible sheet extends between two adjacent support rods in a manner that each slit does not overlap any of the plurality of support rods.

17. An electronic device, comprising:

a chassis;

two end caps arranged at opposite short sides of the chassis; and a rolling display arrangement partially enclosing the chassis, wherein the rolling display arrangement is interlocked with the chassis by grooves extending in the two end caps in a direction perpendicular to a folding axis of a flexible support structure of the rolling display arrangement, and opposing edges of said rolling display arrangement interconnect with the grooves; and wherein the rolling display arrangement comprises:
- a flexible display and the flexible support structure, the flexible support structure supporting the flexible display, and the flexible support structure comprising:
  - a flexible sheet comprising a sheet material, wherein a slit pattern of the sheet material allows the sheet material to fold around the folding axis; and
  - a support arrangement comprising a plurality of support rods arranged to support the flexible sheet, wherein center axes of the plurality of support rods extend in parallel with each other, the flexible sheet, and the folding axis, and each support rod is connected to the flexible sheet by a plurality of attachments, and wherein each slit of the flexible sheet extends between two adjacent support rods in a manner that each slit does not overlap any of the plurality of support rods.

18. The electronic device according to claim 17, wherein the rolling display arrangement is configured to be changeable between a retracted position and an extended position.

* * * * *